United States Patent [19]

Ashley et al.

[11] Patent Number: 5,563,540

[45] Date of Patent: Oct. 8, 1996

[54] ELECTRONIC SWITCH HAVING PROGRAMMABLE MEANS TO REDUCE NOISE COUPLING

[75] Inventors: Donald J. Ashley, Endicott, N.Y.; Michael J. Johnson, Raleigh, N.C.

[73] Assignee: International Business Machines Corporation, Armonk, N.Y.

[21] Appl. No.: 124,516

[22] Filed: Sep. 17, 1993

[51] Int. Cl.$^6$ .............................. H03K 17/16; H03B 1/00
[52] U.S. Cl. ..................... 327/379; 327/384; 327/391; 327/108
[58] Field of Search ....................... 327/379, 384, 327/387, 389, 391, 530, 535, 541, 108, 112, 62, 66, 404, 427, 434, 437; 330/253, 255, 257; 323/312, 315, 316, 317

[56] References Cited

U.S. PATENT DOCUMENTS

| | | | |
|---|---|---|---|
| 3,675,114 | 7/1972 | Nercessian | 323/9 |
| 4,035,715 | 7/1977 | Wyman et al. | 323/4 |
| 4,195,333 | 3/1980 | Hedel | 363/21 |
| 4,257,070 | 3/1981 | Sommer et al. | 358/282 |
| 4,276,590 | 6/1981 | Hansel et al. | 363/71 |
| 4,308,468 | 12/1981 | Olson | 327/94 |
| 4,414,598 | 11/1983 | Nowell | 361/18 |
| 4,415,960 | 11/1983 | Clark Jr. | 363/21 |
| 4,425,613 | 1/1984 | Shelly | 363/26 |
| 4,511,814 | 4/1985 | Matsuo et al. | 327/391 |
| 4,542,305 | 9/1985 | Blauschild | 327/50 |
| 4,609,828 | 9/1986 | Small | 307/44 |
| 4,611,135 | 9/1986 | Nakayama et al. | 327/404 |
| 4,618,779 | 10/1986 | Wiscombe | 307/60 |
| 4,634,895 | 1/1987 | Luong | 327/62 |
| 4,635,178 | 1/1987 | Greenhalgh | 363/65 |
| 4,675,555 | 6/1987 | Okajima et al. | 326/90 |
| 4,717,833 | 1/1988 | Small | 307/44 |
| 4,734,844 | 3/1988 | Rhoads | 363/72 |
| 4,760,276 | 7/1988 | Lethellier | 307/18 |
| 4,766,364 | 8/1988 | Biamonte et al. | 323/272 |
| 4,856,023 | 8/1989 | Singh | 375/3 |
| 4,866,295 | 9/1989 | Leventis et al. | 307/43 |
| 4,877,972 | 10/1989 | Sobhani et al. | 307/43 |
| 4,924,170 | 5/1990 | Henze | 323/272 |
| 4,939,393 | 7/1990 | Petty | 326/78 |
| 5,010,470 | 4/1991 | Lipman et al. | 363/132 |
| 5,014,179 | 5/1991 | Latos | 363/56 |
| 5,023,746 | 6/1991 | Epstein | 361/56 |
| 5,027,255 | 6/1991 | Zeitlin et al. | 361/395 |
| 5,036,452 | 7/1991 | Loftus | 363/71 |
| 5,043,603 | 8/1991 | Ohba et al. | 326/75 |
| 5,051,608 | 9/1991 | Ten Pierick et al. | 327/125 |
| 5,061,862 | 10/1991 | Tamagawa | 327/541 |
| 5,087,871 | 2/1992 | Losel | 323/299 |
| 5,136,183 | 8/1992 | Moyal et al. | 327/63 |
| 5,142,168 | 8/1992 | Matsunaga | 326/90 |
| 5,157,269 | 10/1992 | Jordan et al. | 307/59 |
| 5,164,890 | 11/1992 | Nakagawa et al. | 363/65 |
| 5,200,643 | 4/1993 | Brown | 307/53 |
| 5,200,710 | 4/1993 | Kato | 330/257 |
| 5,204,809 | 4/1993 | Andresen | 363/132 |
| 5,349,559 | 9/1994 | Park et al. | 365/226 |
| 5,412,344 | 5/1995 | Franck | 330/255 |

FOREIGN PATENT DOCUMENTS

| | | |
|---|---|---|
| 524425 | 1/1993 | European Pat. Off. . |
| 63-299767 | 12/1988 | Japan . |
| 2012501 | 7/1979 | United Kingdom . |

*Primary Examiner*—David C. Nelms
*Assistant Examiner*—Trong Phan
*Attorney, Agent, or Firm*—Arthur J. Samodovitz; Eugene I. Shkurko

[57] ABSTRACT

Two controlled current gate drives are provided for driving parallel P and N channel pass devices, so that the rise time of the voltage at one gate of the pass devices overlaps with the fall time of the other to reduce capacitive signal coupling of the signal applied to an FET gate to the FET source and drain. Low-level current sources drive the gates of the pass devices with opposite polarities. A current mirror is used to control the currents provided by the gate drives to control the tradeoff between switching speed and switching noise coupling.

16 Claims, 4 Drawing Sheets

FEEDBACK VOLTAGES IN VTCSL
WITH SIMPLE TGATE (MATCHED SIZE TRANSISTORS).

SWITCHING NOISE ON TRADITIONAL LOW-NOISE SWITCH.

FEEDBACK VOLTAGES IN VTCSL
WITH TGTSS (50 μA BIAS).

SWITCHING NOISE ON CONTROLLABLE-NOISE SWITCH.

5,563,540

ELECTRONIC SWITCH HAVING PROGRAMMABLE MEANS TO REDUCE NOISE COUPLING

CROSS REFERENCE TO RELATED APPLICATIONS

The present application is related to copending applications Ser. No. 08/123,274, filed on Sep. 17, 1993 entitled "Current Share Circuit For DC To DC Converters" and Ser. No. 08/124,323, filed on Sep. 17, 1993 entitled "High Frequency Slope Compensation Circuit" both assigned to the same assignee as the present invention and both incorporated by reference herein.

BACKGROUND OF THE INVENTION

The present invention relates to electronic switches and more particularly to electronic switches using Field Effect Transistors (FETs) suitable for use in integrated circuits as analog switch devices or transmission gates.

Any electronic switch employing FETs exhibits capacitive coupling of the switching signal applied at the FET gate to the switch output and input, FET source and drain, respectively. This cause voltage "spikes" to appear in the switched signal. The problem is especially troublesome when the switch is used, for example, in a sample-and-hold configuration because the spikes can be remembered by the holding circuit. Present methods for reducing these spikes use matched size N-channel and P-channel FETs in parallel, with the gates driven by opposite polarity signals as shown in FIG. 1. This causes coupling from a rising switch signal on the N-channel gate, for example, to be partially cancelled by coupling from a falling signal on the P-channel gate. A major problem with this approach is that the two gate signals of opposite polarity can never be generated at precisely the same time. Because of the skew between the opposite polarity signals the output experiences, for example, an "up" spike followed by a "down" spike.

It is an object of the present invention to provide an electronic switch which reduces spikes from switching noise.

SUMMARY OF THE INVENTION

In one aspect of the present invention a switch with reduced noise coupling is provided which includes current mirror means having a plurality of outputs responsive to an input current. Pass means connect an output to an input to perform the switching. The pass means include an N-channel FET and a P-channel FET connected in parallel with the N-channel FET. Means responsive to a control signal and connected to the current mirror means provide a current of a first polarity to the gate of one of the FETs and a current of an opposite polarity to the gate of the other of the FETs. The magnitude of the currents provided to the gate of the FETs are a function of the input current provided to the current mirror, so that except during switching the N-channel and P-channel FETs are both either conductive or nonconductive.

In another aspect of the current invention a method of switching parallel connected P-channel and N-channel FETs at the same time to reduce noise coupling between the switching signal and the source and drain of the P-channel and N-channel FETs is provided. A first current having a first polarity is provided to the gate of one of the FETs to change the conductivity of the FET. A second current of the opposite polarity to first current and having substantially the same magnitude as the first current is provided to the other FET to change the conductivity of the other FET. The time of charging and discharging of the gates by the first and second currents overlapping to reduce noise coupling through the FETs.

DETAILED DESCRIPTION OF THE INVENTION

Figure 1:
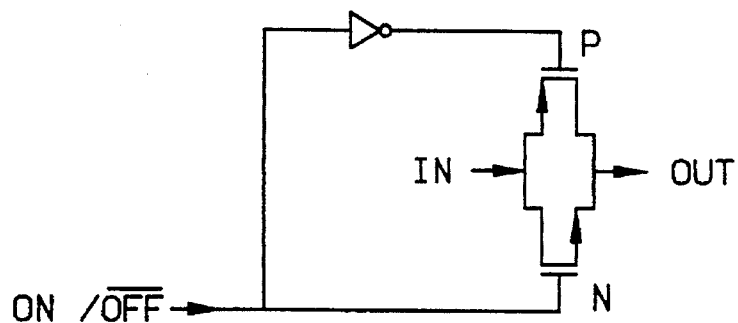
FIG. 1 is a circuit diagram of a prior art method of reducing switching signal coupling.
Figure 2:
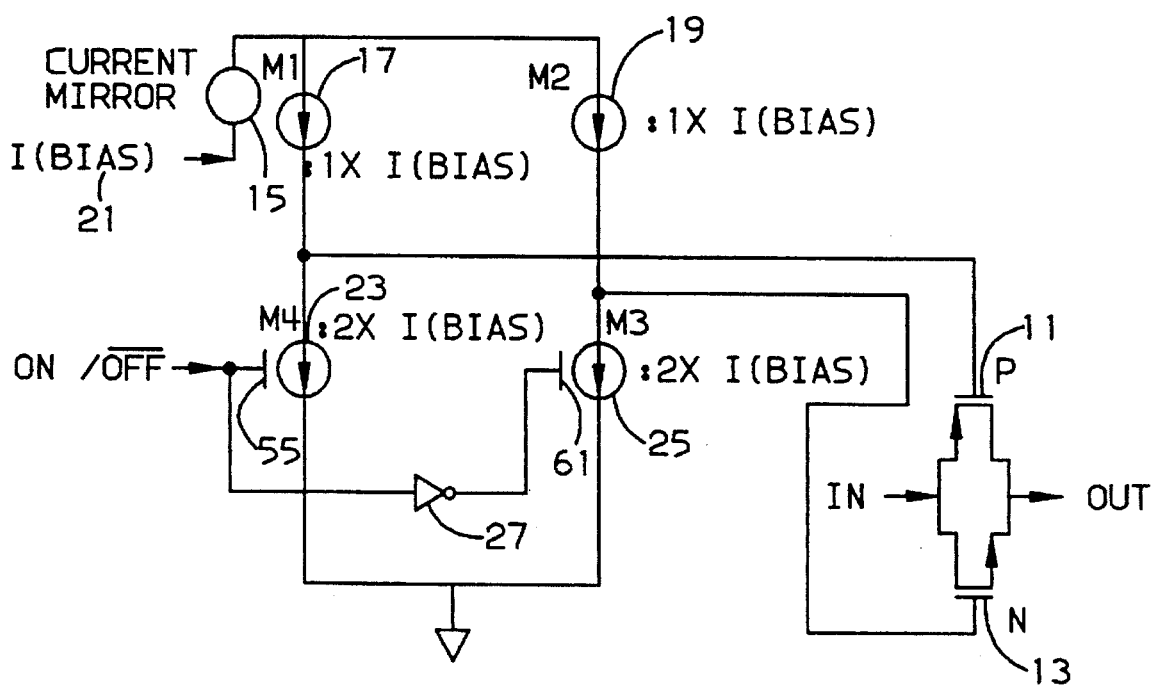
FIG. 2 is a circuit diagram showing a controllable noise switch in accordance with the present invention.

Referring now to the drawing wherein like numerals refer to like elements throughout and particularly FIG. 2 thereof, an electronic switch in accordance with the present invention is shown. The input of the electronic switch is connected to the source of a P-channel FET 11 and the drain of an N-channel FET 13, which are the pass devices of the switch. The output of the switch is connected to the drain of the P-channel FET 11 and the source of the N-channel FET 13. A current mirror 15 having multiple output current sources 17 and 19 receives a programming current I(BIAS) at its programming current source input 21. An output current of I(BIAS) is sourced by the first output 17 of the current mirror to the gate of the P-channel FET 11 and to a switched current source 23, which sinks a current of twice I(BIAS) when activated. The second output of the current mirror 19 sources a current of I(BIAS) to the gate of N-channel FET 13 and to a switched current source 25, which sinks a current of twice I(BIAS) when activated. Switched current sources can comprise N-channel FETs. An ON/OFF control for the electronic switch is coupled to the gate of switched current source 23 and through an inverter 27 to the gate of the second switched current source 25. The junction of current source 17 and switched current source 23 is connected to the gate of P-channel FET 11 and the junction of current source 19 and switched current source 25 is connected to the gate of N-channel FET 13.

In operation, the mirrored current source always source currents equal to I(BIAS) at outputs 17 and 19. Switched current sources 23 and 25 sink either no current or two times I(BIAS) depending on whether they are switched off or on, respectively. The switched current sources are switched with opposite polarities so that while one switched current source is sinking no current the other is sinking two times I(BIAS). When the signal provided at the ON/OFF input is high, switched current source 23 is turned on while switched current source 25 receives an inverted signal from inverter 27 turning switched current source 25 off. Since switched current source 23 sinks a current of twice I(BIAS), a current of I(BIAS) is drawn from the P-channel FET 11 reducing its gate voltage, biasing transistor 11 into conduction. At the same time a current of I(BIAS) is supplied from mirrored current source output 19 to the N-channel FET 13 increasing its gate voltage and biasing transistor 13 into conduction. When the control signal goes low, switched current source 23 is turned off causing mirrored current source output 17 to provide a current of I(BIAS) to the P-channel FET 11 increasing its gate voltage and turning off transistor 11. At the same time switched current source 25 receives an inverted control signal turning switched current source 25 on. Switched current source 25 sinks a current of twice I(BIAS) causing a current of I(BIAS) to flow from the gate of N-channel FET 13 turning transistor 13 off. By increasing or decreasing the amount of current I(BIAS) provided to the input of the current mirror 21 the rate at which the gates of the pass devices 11 and 13 are charged and discharged are controlled, with increasing I(BIAS), increasing the charging and discharging rates.

The skew between the switching of the two pass devices 11 and 13 is reduced by slowing down the change in voltage at the gates so that the rise time of one overlaps to a greater degree the fall time of the other using low-level current sources to drive the gates of the pass devices. Of course, the slower the rise and fall times of the voltages at the gates of the pass devices, the greater the switching delay. A single current mirror 15 is used to control the tradeoff between switching speed and switching noise coupling.

A slowly changing gate voltage signal does not in itself solve the problem of noise coupling. What is important is the amount of time overlap between rising and falling voltages at the gates of the two pass devices. For example, if the slowing changing gate voltages at the two pass devices 11 and 13 remain separated in time, the output of the pass devices will still exhibit "up" and "down" shifts of a magnitude determined roughly by the ratio of gate-source capacitance plus gate-drain capacitance to drain-ground plus source-ground capacitance.

Figure 3:
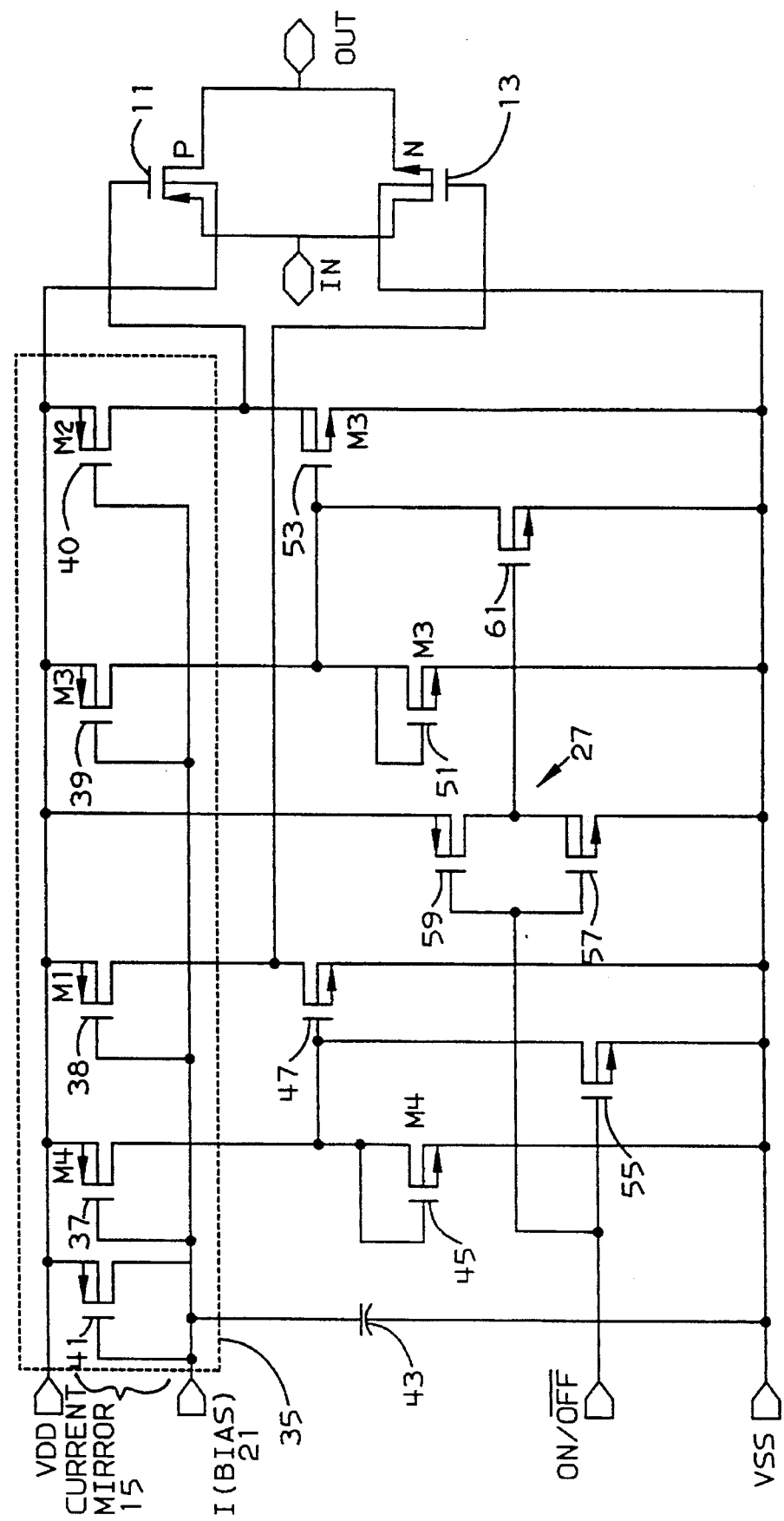
FIG. 3 is a more detailed implementation of the circuit diagram of FIG. 2.

A more detailed schematic diagram of the electronic switch is shown in FIG. 3, which is implemented in silicon using CMOS technology. The input to the switch is connected to the source of a P-channel MOSFET 11 and to the drain of a N-channel MOSFET 13. The output of the switch is connected to the drain of the P-channel MOSFET 11 and to the source of the N-channel MOSFET 13. A current mirror 15 having four output current sources provided by P-channel MOSFETs 37, 38, 39 and 40, receives a programming current I(BIAS) 21 at the programming current source shown as an P-channel MOSFET 41. The gate of each of the five P-channel MOSFETs 37–41 in the current mirror 15 are connected to one another. The drain and gate of FET 41 are connected to one another. The sources of the five transistors 37–41 are connected to supply voltage VDD. The drain of transistor 41 is connected through a capacitor 43 to supply voltage VSS which is more negative than supply voltage VDD. A first output of the current mirror shown as the drain of FET 37, is connected to the drain and gate of an N-channel MOSFET 45 which is configured as a resistance. The source of MOSFET 45 is connected to supply voltage VSS.

A second output of the current mirror shown as the drain of FET 38, is connected to a switched current source shown as N-channel MOSFET 47. The drain of FET 47 is connected to the drain of FET 38. The source of FET 47 is connected to supply voltage VSS. The gate of FET 47 is connected to the junction of the drains of FETs 37 and 45. The third output of the current source shown as the drain of transistor 39, is connected to the drain and gate of an N-channel MOSFET 51, which is configured as a resistance. The source of MOSFET 51 is connected to the supply voltage VSS. The fourth output of the current source, shown as the drain of FET 40, is connected to a switched current source shown as a N-channel MOSFET 53. The drain of FET 53 is connected to the drain of FET 40. The source of FET 53 is connected to VSS. The gate of FET 53 is connected to the junction of the drains of FETs 39 and 51.

A logic-level controlling clock signal on/off not is connected to the gate of an N-channel MOSFET 55. The drain of FET 55 is connected to the gate of FET 47 and the source if FET 55 is connected to supply voltage VSS. The control signal is also connected to the gates of an N-channel FET 57 and to the gate of a P-channel FET 59. FETs 57 and 59 are connected to form a logic-level inverter. The source of FET 59 is connected to supply voltage VDD and the drains of FETs 57 and 59 are connected to one another. The source of FET 57 is connected to supply voltage VSS. The junction of the drains of FETs 57 and 59 is connected to the gate of N-channel FET 61. The drain of FET 61 is connected to the gate of FET 53 and the source of FET 61 is connected to supply voltage VSS. The gate of FET 11 is connected to the junction of the drains of FETS 38 and 47. The gate of FET 13 is connected to the junction of FETs 40 and 53. The substrates of FETs 37–41, 45, 47, 51, 53, 55, 57, 59, and 61 are tied to their respective source terminals. The substrate of FET 11 is tied to supply voltage VDD while the substrate of FET 13 is tied to supply voltage VSS.

In operation, current I(BIAS) programs the multiple output current mirror. The on/off control signal is used to turn on and off the pass devices. When the clock signal is high, FET 55 is turned on which turns off FET 47. FET 38 provides a current of I(BIAS) to the gate of pass device 11 increasing the gate voltage which turns off pass device 11. The control signal is also connected to the gates of FETs 57 and 59. FET 57 is biased into conduction connecting the gate of FET 61 to VSS causing FET 61 to be nonconductive. FET 53 is biased into conduction due to the voltage drop across FET 51 from the current provided by FET 39. FET 53 conducts a current equal to twice the I(BIAS). The current carried by the FETs is determined by their channel widths when fabricated. FETs 47 and 53 each have a channel width of twice that of each of the FETs in the current mirror 15. FET 40 provides a current of I(BIAS) with a current of I(BIAS) drawn from the gate of pass device 13 biasing the pass device 13 off. A current of I(BIAS) is provided to the gate of FET 11 at the same time a current of I(BIAS) is removed from the gate of FET 13 with the resulting decrease in voltage at FET 13 occurring at the same time as the increase of voltage at FET 11. This simultaneous change occurs because the gate charge/discharge times of FETs 13 and 11 are long compared to the propagation delay time into inverting stage, FETs 13 and 11. The gate charge/discharge times of FETs 13 and 11 are controlled by controlling I(BIAS). When the control signal is low, FET 55 is turned off and the voltage drop across FET 45 caused by the current from FET 37 turns on FET 47. FET 47 sinks a current of twice I(BIAS). A current of I(BIAS) is provided by FET 38 and a current of I(BIAS) is drawn from the gate of FET 11 turning FET 11 on. The low clock signal turns on FET 59 and turns off FET 57. FET 61 is biased into conduction causing FET 53 to be turned off. FET 40 provides a current of I(BIAS) to the gate of FET 13 increasing the gate voltage turning FET 13 on.

Figure 4:
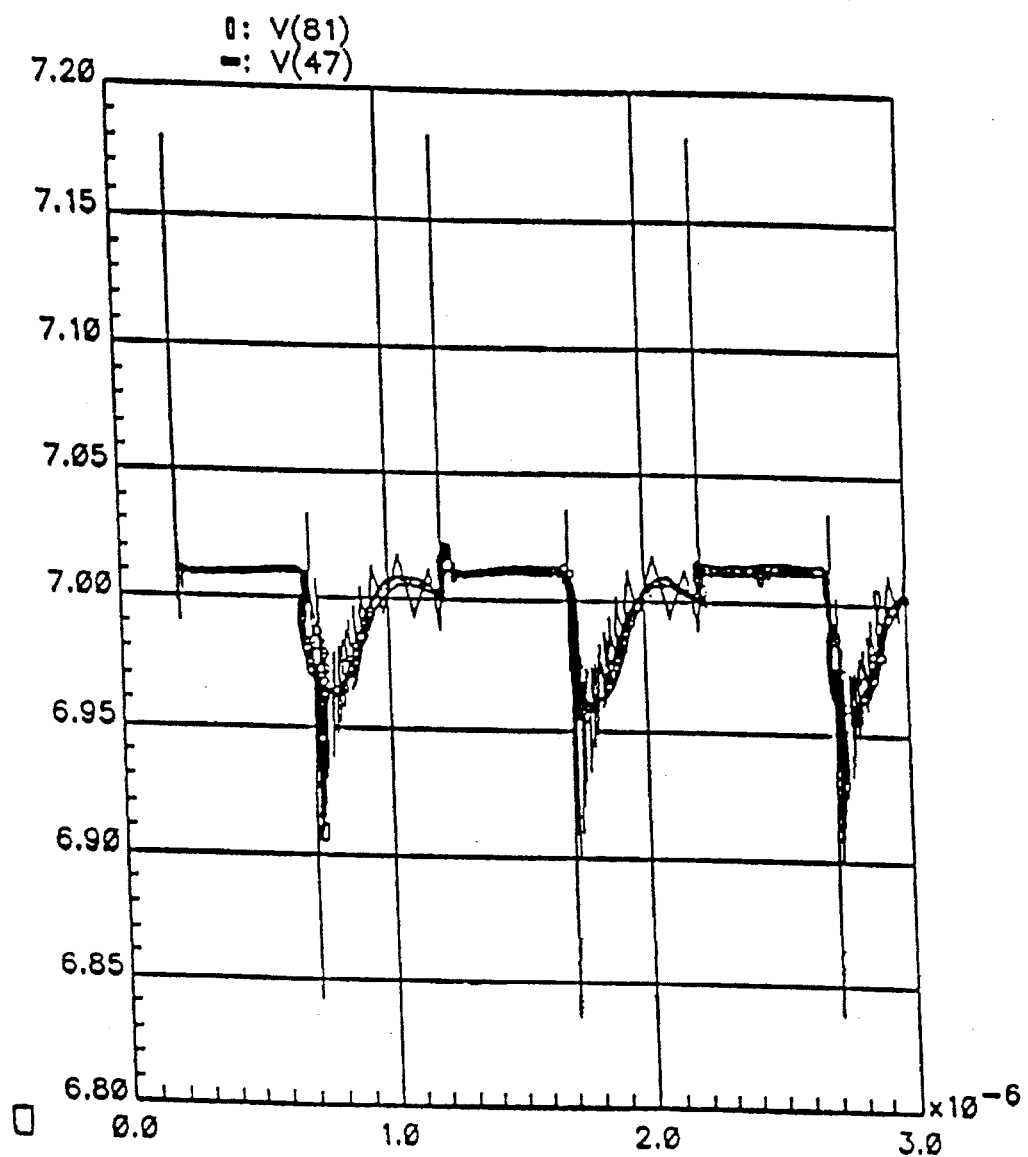
FIG. 4 shows a SPICE simulation of the output voltage of N and P channel devices driven by standard digital drivers.

FIG. 4 shows a SPICE simulation of the output voltage of N and P channel devices driven by standard digital drivers. Voltage spikes from switching noise are about 160 mV in magnitude. After RC filtering, the signal degradation is about 40 mV in magnitude.

Figure 5:
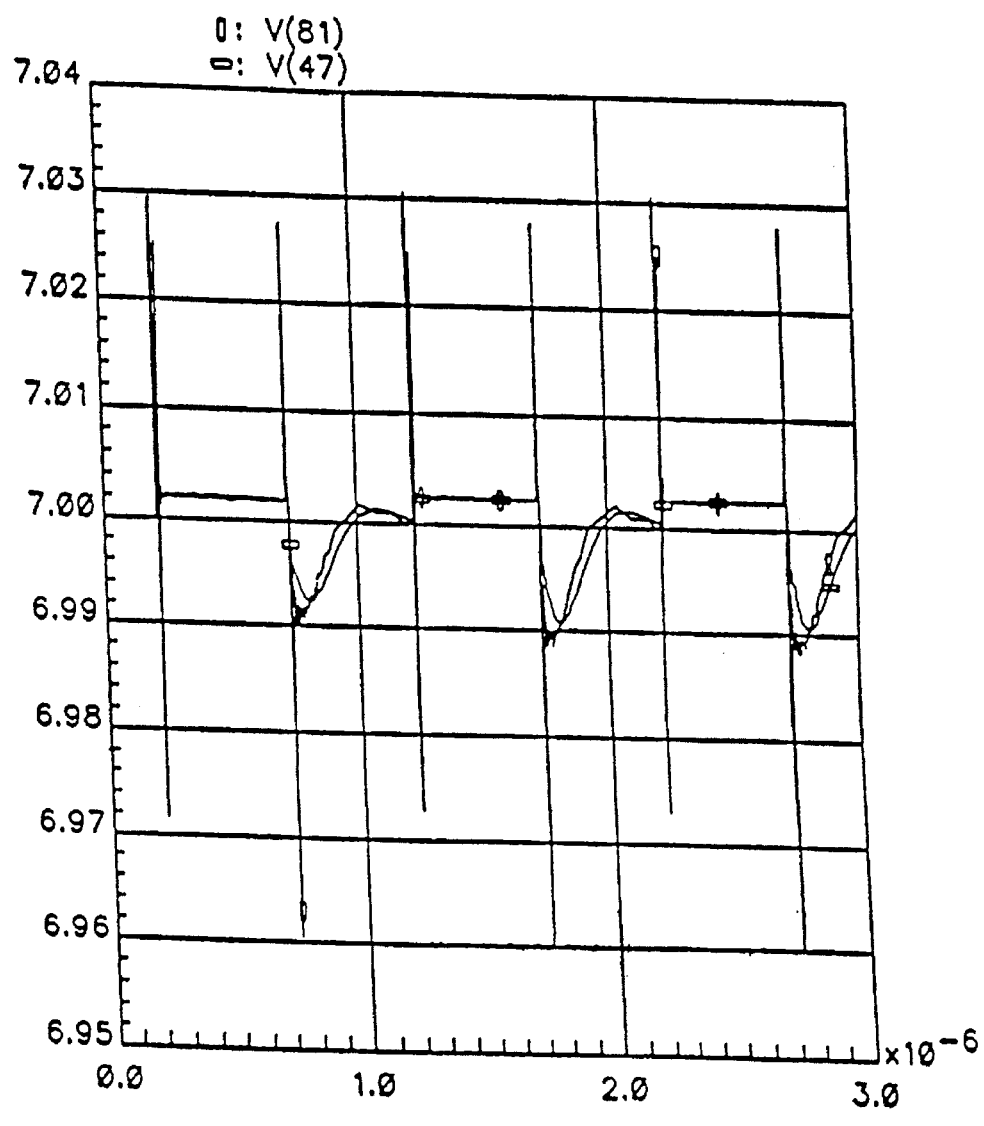
FIG. 5 shows a SPICE simulation of the output voltage of FIG. 3.

FIG. 5 shows a SPICE simulation of the output voltage of FIG. 2. A current I(BIAS) of 50 microamperes was assumed. The on resistance of the parallel combination of the pass devises was assumed to be 1 k ohms. The voltage spikes from switching noise are now only about 40 mV in magnitude and after RC filtering the signal degradation is only about 10 mV. The RC filter was assumed to have a resistance of 11.4 k ohms and a capacitance of 3 picofarads.

The foregoing has described an electronic switch which reduces spikes from switching noise and is suitable for use in sample and hold circuits and wherever analog switch devices or transmission gates are needed.

While the invention has been particularly shown and described with reference to a preferred embodiment thereof, it will be understood by those skilled in the art that various changes in form and detail may be made therein without departing from the spirit and scope of the invention.

What is claimed is:

1. A switch comprising:

current mirror means having a plurality of outputs responsive to an input current;

an N-channel FET and a P-channel FET connected in parallel with each other to control passage of an input to an output; and control means connected to said current mirror means, and responsive to a first control signal for causing said current mirror means to output a transition current of a first polarity to a gate of one of said FETs and a transition current of substantially the same magnitude but opposite polarity to a gate of the other of said FETs to activate both of said FETs substantially simultaneously, and responsive to a second control signal for causing said current mirror means to output a transition current of said first polarity to the gate of said other FET and a transition current of substantially the same magnitude but said opposite polarity to the gate of said one FET to deactivate both of said FETs substantially simultaneously, magnitudes of all of said transition currents being a function of the input current provided to said current mirror.

2. A switch with reduced noise coupling comprising:

current mirror means having a plurality of outputs responsive to an input current;

pass means for connecting an input to an output to perform switching, said pass means including an N-channel FET and a P-channel FET connected in parallel with said N-channel FET;

drive means connected to said current mirror means including first and second controllable current sources for sinking a predetermined amount of current greater than the current provided by the individual outputs of the current mirrors or not sinking current responsive to a control signal, said controllable current sources alternately operable, each of said controllable current sources connected in series with an output of said current mirror, the gate of said N-channel FET connected to the junction of the output of said current mirror and one of said controllable current sources, the gate of said P-channel FET connected to the junction of another output of said current mirror and the other controllable current source with current of a first polarity being provided to the gate of one of said FETs and a current of an opposite polarity being provided to a gate of the other of said FETs, the magnitude of said currents being a function of the input current provided to said current mirror, so that said FETs are both either conductive or nonconductive.

3. A method of switching parallel connected P-channel and N-channel FETs substantially simultaneously, said method comprising the following steps performed substantially simultaneously:

providing a first current having a first polarity to the gate of one of said FETs to change the conductivity of said one FET; and providing a second current having substantially the same magnitude but opposite polarity as said first current to the gate of the other FET, to change the conductivity of said other FET, such that both of said FETs activate substantially simultaneously.

4. A method as set forth in claim 3 further comprising the following steps performed substantially simultaneously with each other:

providing a third current having said opposite polarity to the gate of said one FET to change the conductivity of said one FET; and providing a fourth current having substantially the same magnitude as said third current but said first polarity to the gate of said other FET, to change the conductivity of said other FET, such that both of said FETs deactivate substantially simultaneously.

5. A method of switching parallel connected P-channel and N-channel FETs substantially simultaneously, said method comprising the following steps performed substantially simultaneously:

providing, from a first output of a current mirror, a first transition current having a first polarity to the gate of one of said FETs to deactivate said one FET; and providing, from a second output of said current mirror, a second transition current having substantially the same magnitude but opposite polarity as said first current to the gate of the other FET to deactivate said other FET substantially simultaneously with said one FET.

6. An electronic switch comprising:

a first current source and a first current sink coupled to receive current of said first current source when said first current sink is active;

a second current source and a second current sink coupled to receive current of said second current source when said second current sink is active;

an N-channel FET and a P-channel FET connected in parallel with each other to pass an input to an output when both of said FETs are active, a gate of said P-channel FET being coupled between said first current source and said first current sink, and a gate of said N-channel FET being coupled between said second current source and said second current sink;

control means for activating said first current sink and deactivating said second current sink substantially simultaneously, and deactivating said first current sink and activating said second current sink substantially simultaneously; and means for biasing said first and second current sources to source current corresponding to a bias current.

7. A switch as set forth in claim 6 wherein the biasing means controls transition time of said FETs.

8. A switch as set forth in claim 6 wherein the biasing means biases said first and second current sinks to sink a current corresponding to said bias current.

9. A switch as set forth in claim 6 wherein said first and second current sources source substantially the same current as each other.

10. A switch as set forth in claim 9 wherein said first and second current sinks sink substantially the same current as each other.

11. A switch as set forth in claim 6 wherein said control means comprises an inverter connected between input controls of said first and second current sinks, whereby when said first current sink is activated said second current sink is deactivated and vice versa.

12. A switch as set forth in claim 6 wherein said input is provided at a drain of one of said FETs and a source of the other FET and said output is provided at a source of said one FET and a drain of said other FET.

13. A switch as set forth in claim 6 wherein when said first current sink is activated said first current sink activates said P-channel FET and said second current source activates said N-channel FET.

14. A switch as set forth in claim 13 wherein when said second current sink is activated said second current sink deactivates said N-channel FET and said first current source deactivates said P-channel FET.

15. An electronic switch comprising:

a first current source and a first current sink coupled to receive current of said first current source when said first current sink is active;

a second current source and a second current sink coupled to receive current of said second current source when said second current sink is active, said first and second current sources sourcing substantially the same current as each other, said first and second current sinks sinking substantially the same current as each other and double the current of said first and second current sources, respectively;

an N-channel FET and a P-channel FET connected in parallel with each other to pass an input to an output when both of said FETs are active, a gate of said P-channel FET being coupled between said first current source and said first current sink, and a gate of said N-channel FET being coupled between said second current source and said second current sink; and control means for activating said first current sink and deactivating said second current sink substantially simultaneously, and deactivating said first current sink and activating said second current sink substantially simultaneously.

16. An electronic switch comprising:

an N-channel FET and a P-channel FET connected in parallel with each other to control passage of an input to an output; and current mirror means, responsive to a first control signal for providing a transition current of a first polarity at a gate of one of said FETs and a substantially equal and substantially simultaneous transition current of an opposite polarity at a gate of the other FET to activate both of said FETs substantially simultaneously, and responsive to a second control signal for providing a transition current of said first polarity at the gate of said other FET and a substantially equal and substantially simultaneous transition current of said opposite polarity at the gate of said one FET to deactivate both of said FETs substantially simultaneously.

* * * * *